(12) United States Patent
Matera

(10) Patent No.: US 6,239,611 B1
(45) Date of Patent: *May 29, 2001

(54) CIRCUIT AND METHOD FOR TESTING WHETHER A PROGRAMMABLE LOGIC DEVICE COMPLIES WITH A ZERO-HOLD-TIME REQUIREMENT

(75) Inventor: Michael M. Matera, Mt. View, CA (US)

(73) Assignee: Xilinx, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/329,962

(22) Filed: Jun. 10, 1999

(51) Int. Cl.[7] .................................................. H03K 19/00
(52) U.S. Cl. .................................. 326/16; 326/38; 326/41
(58) Field of Search .................................. 326/16, 38–41

(56) References Cited

U.S. PATENT DOCUMENTS

| Re. 34,916 | * | 4/1995 | Sweeney ................................. 326/16 |
| 5,815,726 | * | 9/1998 | Cliff ................................ 395/800.01 |
| 5,869,981 | * | 2/1999 | Agrawal et al. ........................ 326/39 |

OTHER PUBLICATIONS

Nick Camilleri and Chris Lockhard, Xilinx Application Note entitled, "Improving XC4000 Design Performance," XAPP 043.000, pp. 8–21 through 8–35, available from Xilinx, Inc. 2100 Logic Drive, San Jose, CA 95124–3400. , Peter Alfke; Xilinx Application Note XAPP 095 entitled, "Set–up and Hold Times," Nov. 24, 1997 (version 1.0), p. 13–50, available from Xilinx, Inc., 2100 Logic Drive, San Jose, CA 95124–3400.

* cited by examiner

Primary Examiner—David Nelms
Assistant Examiner—Gene N. Auduong
(74) Attorney, Agent, or Firm—Arthur J. Behiel; Edel M. Young

(57) ABSTRACT

Described are a system and method for quickly and accurately testing sequential storage elements on programmable logic devices for zero-hold-time compliance. A programmable logic device is configured such that both the data and clock terminals of a selected sequential logic element connect to an input pin of the programmable logic device and the output terminal of the sequential logic element connects to an output pin of the programmable logic device. A circuit tester connected to the input pin then generates a signal transition on the input pin so that the signal transition traverses both the data and clock paths in a race to the sequential storage element. The circuit tester also includes an input terminal that monitors the PLD output pin to determine whether the storage element contains the correct data after the storage element is clocked. Incorrect data stored in the sequential storage element after the storage element is clocked indicates that the clock signal arrived before the data, and therefore that the selected storage element violated the zero-hold-time requirement in the specified configuration.

17 Claims, 5 Drawing Sheets

CIRCUIT AND METHOD FOR TESTING WHETHER A PROGRAMMABLE LOGIC DEVICE COMPLIES WITH A ZERO-HOLD-TIME REQUIREMENT

FIELD OF THE INVENTION

This invention relates generally to methods and circuits for testing programmable logic devices, and in particular to methods and circuits for ensuring that programmable logic devices meet zero-hold-time requirements.

BACKGROUND

"Set-up time" and "hold time" describe the timing requirements on the data input of a sequential logic element, such as a flip-flop or register, with respect to a clock input. The set-up and hold times define a window of time during which data must be stable to guarantee predictable performance over a full range of operating conditions and manufacturing tolerances.

FIG. 1 illustrates three clock-to-data timing relationships used to describe the relationships between set-up time, hold time, and a clock edge. Referring to the first example, the set-up time SUT is the length of time that data must be available and stable before the arrival of a clock edge 100. The hold time HT is the length of time that data to be clocked into the storage element must remain stable after the arrival of clock edge 100. Positive hold times limit the maximum clock rate of a system. Thus, chip designers and system designers strive to meet zero-hold-time requirements.

The second example in FIG. 1 illustrates the input and output signals of a flip-flop that meets a zero-hold-time requirement. The data, a logic one at the onset of rising edge 110, propagates through the selected logic element to raise the output signal OUT to a logic one. The third example illustrates the input and output signals of a flip-flop that fails to meet a zero-hold-time requirement. The data, a logic one at the onset of rising edge 120, does not initiate the requisite logic one output signal OUT.

IC designs typically guarantee that any individual sequential logic element does not require a positive hold time with respect to the corresponding clock signal. Hold-time requirements between flip-flops or registers on the same chip can be avoided by careful design of the on-chip clock distribution network.

The time required for the output of a sequential storage element to change states in response to a clock is termed the "clock-to-out" delay. If the worst-case clock-skew value is shorter than the sum of the minimum clock-to-out delay plus the minimum signal propagation delays between sequential elements, then there is never any on-chip hold-time problem. It can be difficult, however, to avoid hold-time problems for sequential storage elements that communicate with data sources external to the chip.

Device data inputs will have a positive (non-zero) hold-time requirement if the internal clock distribution delay is longer than the data input delay. This means that the data source, usually another IC driven by the same clock signal, must guarantee to maintain data signals beyond the clock edge. Otherwise, the receiving device might erroneously input the next (incorrect) data instead of the data created by the current clock. This is called a race condition, and can cause fatal system failures.

If the receiving device has a hold time requirement, the data source must guarantee an equivalent minimum value for its clock-to-out delay. Few IC manufacturers are willing to do this, and in the few cases where it is done, the minimum value is typically a token one nanosecond. Any input hold time requirement is, therefore, an invitation to system failure. Clock delays induced by the interconnections between ICs can make matters worse.

FIG. 2 illustrates a conventional programmable input block 200 that addresses potential hold-time problems. (Input block 200 is part of an input/output block on a Xilinx XC4000 FPGA.) Input block 200 includes an input buffer 205, programmable delay circuit 210, a sequential storage element 215, and three programmable multiplexers 220, 225, and 230. A programmable multiplexer 240 can be programmed to insert one or both of delay elements 235 into the incoming data path to compensate for clock delays induced by relatively long signal paths in the clock distribution network. Multiplexer 230 includes both inverting and non-inverting inputs, allowing storage element 215 to clock on either positive or negative clock edges.

FIG. 3 depicts a conventional test configuration 300 for ensuring that a selected sequential storage element on a programmable logic device meets a zero-hold-time requirement. System 300 includes a conventional tester 305 connected to a field-programmable gate array (FPGA) 310. FPGA 310 is a well-known type of programmable logic device, and might be one of the Spartan™ series of FPGAs available from Xilinx, Inc., of San Jose, Calif. FPGA 310 includes an array of configurable logic blocks 311, or CLBS, that are programmably interconnected to each other and to programmable input/output blocks 312 (IOBs). This collection of configurable logic may be customized by loading configuration data into internal configuration memory cells that define how the CLBs, interconnections, and IOBs are configured. FPGA 310 additionally includes a clock distribution network 313 that can be connected to an external clock source (not shown) via eight global clock buffers 314 located in the four corners of FPGA 310. Each global clock buffer 314 has a corresponding pass transistor for gating an external clock signal to the input terminal of the respective clock buffer. For example, a pass transistor 315 selectively gates the signal on an input pin 325 through one of clock buffers 314 to clock distribution network 313. The signal on input pin 325 is additionally available to IOB 312B.

Clock distribution network 313 can be programmably connected to any of CLBs 311 or IOBs 312. In the depicted example, clock distribution network 313 connects input pin 325 to an input terminal of IOB 312A via clock distribution network 313.

Each programming point, CLB, interconnection line, and IOB introduces some delay into a signal path. The many potential combinations of these and other delay-inducing elements make timing predictions difficult. Testing an FPGA to ensure that all input paths meet a zero-hold-time requirement is therefore very time consuming. There is therefore a need for a faster method of testing for zero-hold-time compliance.

Tester 305 includes a pair of output leads 317 and 320 connected to respective input/output pins 325 and 330 of FPGA 310. Tester 305 also includes an input line 335 connected to an input/output pin 340 of FPGA 310. Tester 305 simultaneously applies input signals to pins 325 and 330 and monitors the output signal on line 335 to determine whether the correct data on line 320 clocks into IOB 312A. An incorrect logic level on line 320 indicates a hold-time violation.

Conventional test configuration 300 can be inaccurate due to the imprecision of tester 305 and the impact of leads 317 and 320 on the measurement. Testers have tolerances that can have a significant impact on some measurements, particularly when the signal propagation delay of interest is short. For example, if tester 305 can be relied upon to produce a signal edge accurate to one nanosecond, then the difference between "simultaneously" developed signals on lines 317 and 320 can only be assumed to be accurate to two nanoseconds.

Parts that are found acceptable by tester 305 but that fail to meet zero-hold-time requirements in customer applications lead to unhappy customers. Thus, IC manufacturers tend to add relatively large margins of error, or "guard bands," to ensure that their circuits will perform as advertised. If the difference between "simultaneously" developed signals can only be assumed to be accurate to two nanoseconds, for example, then IC manufacturers would typically provide a guard band of at least two-nanoseconds. Unfortunately, this means that manufacturers would not be able to guarantee the highest potential speed performance, which could cost them customers in an industry where speed performance is paramount.

IC manufacturers would like to guarantee that their products meet zero-hold-time requirements while rejecting as few good parts as possible. There is therefore a need for a more accurate means of testing for zero-hold-time compliance.

SUMMARY

The present invention is directed to a system and method for quickly and accurately testing sequential storage elements on programmable logic devices for zero-hold-time compliance. In accordance with the method, a programmable logic device is configured such that both the data and clock terminals of a selected sequential logic element connect to an input pin of the programmable logic device and the output terminal of the sequential logic element connects to an output pin of the programmable logic device. A circuit tester connected to the input pin then generates a signal transition on the input pin so that the signal transition traverses the data and clock paths in a race to the sequential storage element. The circuit tester also includes an input terminal that monitors the PLD output pin to determine whether the storage element contains the correct data after the storage element is clocked. Incorrect data stored in the sequential storage element after the storage element is clocked indicates that the clock signal arrived before the data, and therefore that the storage element violated the zero-hold-time requirement in the specified configuration.

The clock path for the selected storage element is generally the longest of many possible clock paths, and therefore represents a worst-case clock path from the perspective of satisfying a zero-hold-time requirement. The data path for the selected storage element is generally the shortest delay path, and therefore represents a worst-case data path, again from the perspective of satisfying a zero-hold-time requirement. If the selected storage element meets the zero-hold-time requirement with worst combination of data and clock delays, then the selected storage element and similar storage elements should always meet the zero-hold-time requirement. The present invention thus allows a circuit vendor to test whether each storage element meets a zero-hold-time requirement using a simple test of a single storage element.

DETAILED DESCRIPTION

Figure 1:
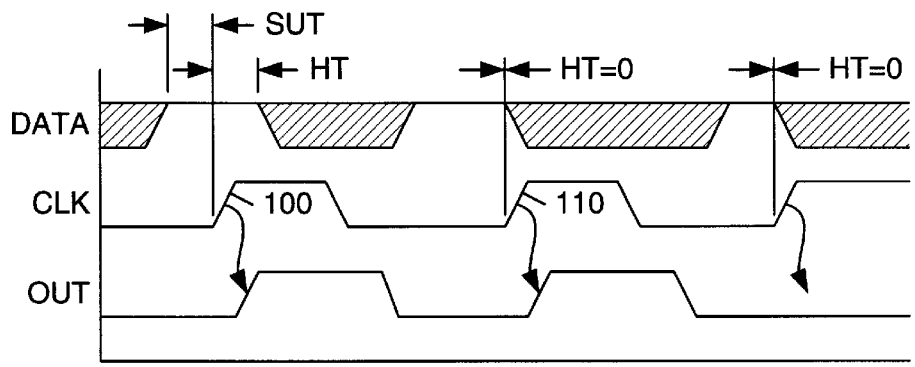
FIG. 1 illustrates three clock-to-data timing relationships used to describe the relationships between set-up time, hold time, and a clock edge.
Figure 2:
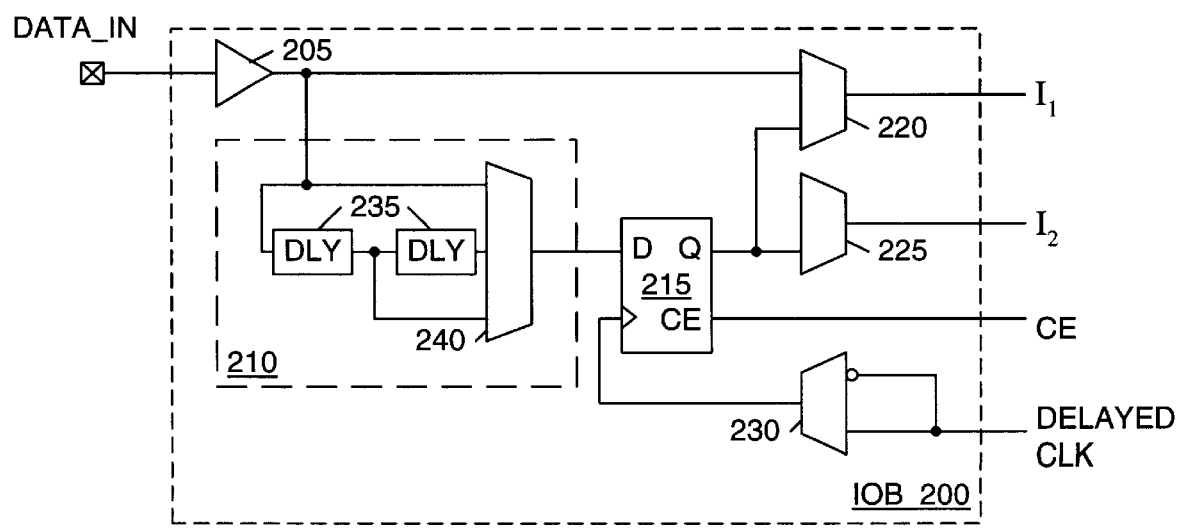
FIG. 2 illustrates a programmable input block 200 that addresses potential hold-time problems.
Figure 3:
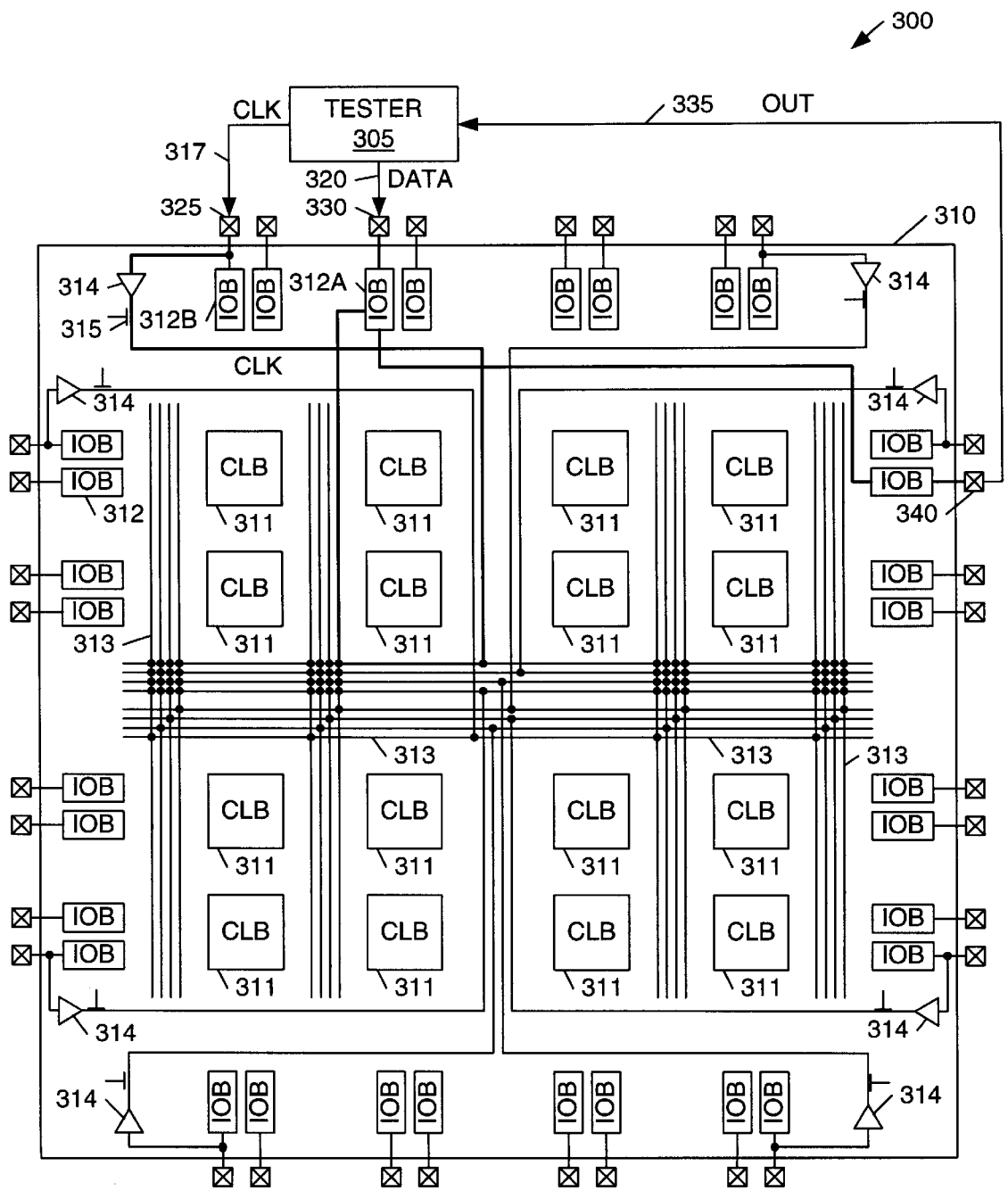
FIG. 3 depicts a conventional test configuration 300 for ensuring that a selected sequential element on a programmable logic device meets a zero-hold-time requirement.
Figure 4A:
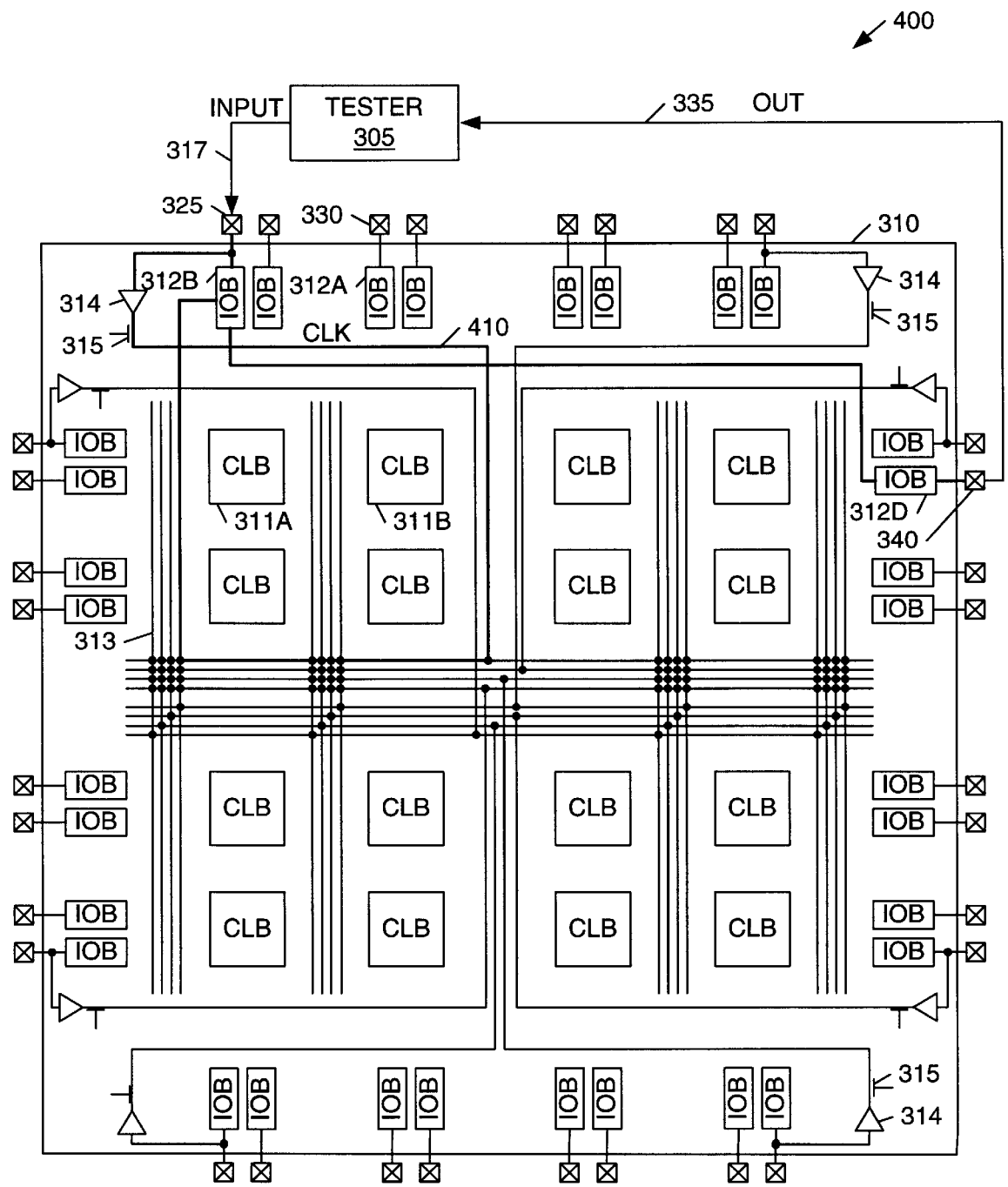
FIG. 4A depicts a test configuration 400 in accordance with the invention.
Figure 4B:
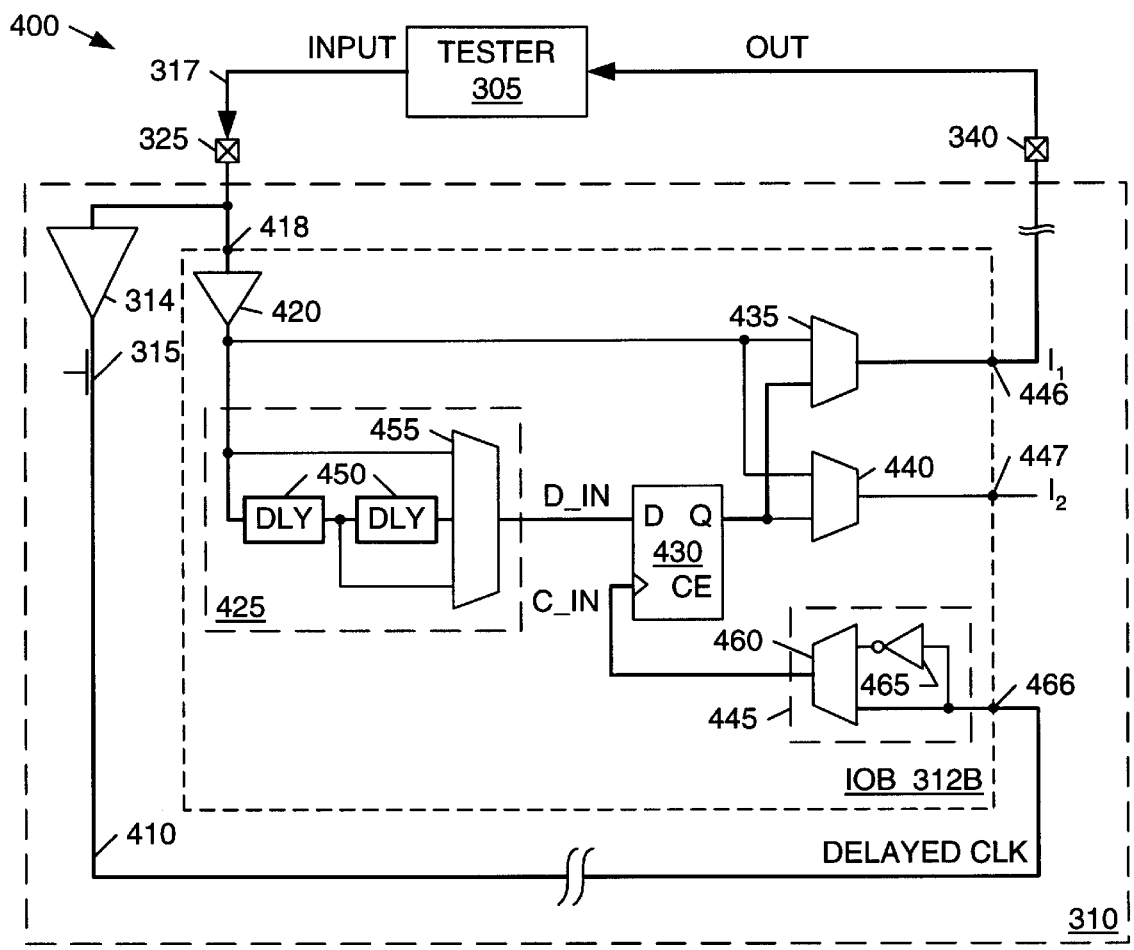
FIG. 4B is a second depiction of test configuration 400 of FIG. 4A.

FIG. 4A depicts a test configuration 400 in accordance with the invention. Test configuration 400 is similar to test configuration 300 of FIG. 3, like-numbered elements being the same. In accordance with the invention, pass transistor 315 and clock distribution network 313 are configured such that input pin 325 connects to IOB 312B at two points. First, input pin 325 connects directly to a data input terminal of IOB 312B. Second, input pin 325 connects to a clock terminal of IOB 312B via a buffer 314, a pass transistor 315, and a clock path 410 through clock distribution network 313. A heavy line labeled CLK identifies clock path 410. FIG. 4B, discussed below, shows the connections and terminals of IOB 312B in greater detail.

Clock path 410 is selected from among many possible clock paths because path 410 is among the longest clock paths of clock distribution network 313, and therefore presents a worst-case clock delay for FPGA 310. The data path between input pin 325 and IOB 312B is among the shortest data input paths on FPGA 310. IOB 312B, configured as shown, therefore represents a worst-case example for testing hold-time requirements of FPGA 310. If IOB 312B meets the zero-hold-time requirement with the fastest data path and slowest clock path, then IOB 312B should always meet the zero-hold-time requirement. Furthermore, the remaining IOBs 312 should also meet the zero-hold-time requirement because each of the remaining IOBs 312 has a data path that is as long or longer than that of IOB 312B and a clock path that is as short or shorter than clock path 410. Thus, a simple test of a single IOB can be used to ensure that each IOB meets a zero hold-time requirement.

FIG. 4B is a second depiction of test configuration 400, this time detailing IOB 312B; the remaining IOBs, CLBs, buffers, and clock lines are omitted for clarity.

IOB 312B, like the other IOBs 312, includes a data input terminal 418, an input buffer 420, a programmable delay element 425, a sequential storage element 430, a pair of output multiplexers 435 and 440, a clock-edge-polarity selection circuit 445, and a pair of output terminals 446 and 447. Programmable delay element 425 includes a pair of delay elements 450 and a programmable multiplexer 455 configured to add zero, one, or both programmable delay elements in the data path between buffer 420 and the D-input of sequential storage element 430, in this case a D flip-flop. Adding both delay elements 450 induces the maximum input delay, and therefore offers the greatest protection against hold-time violations. Selection circuit 445 includes a multiplexer 460 and an inverter 465.

Each of multiplexers 435, 440, 455, and 460 is controlled by corresponding programming signals (not shown). Multiplexers 435 and 440 can be programmed to select the output of buffer 420 either directly or through storage element 430, and can further be programmed to provide these outputs on either terminal $I_1$ or terminal $I_2$. In the present example, multiplexer 435 connects the Q output from storage element 430 to input/output pin 340. Multiplexer 460 can be programmed to invert the sense of the clock signal on line CLK so that storage element 430 stores data in response falling-edge signals on a clock terminal 466. Clock terminal 466 is the clock-input terminal to IOB 312B and one of many potential output terminals of clock network 313.

The bold lines from input/output pin 325 to input/output pin 340 identify a signal path that traverses FPGA 310 to test whether the inclusion of both delay elements 450 will ensure that all sequential storage elements in FPGA 310 will meet a zero-hold-time requirement. The clock signal path 410 is depicted in FIG. 4A, and results in a delayed clock signal to clock terminal 466. The data path from input pin 325 extends through input buffer 420, both delay elements 450, and multiplexer 455 to storage element 430. The output of storage element 430 exits IOB 312B via multiplexer 435 and extends to output pin 340 through the path depicted in FIG. 4A.

Figure 5A:
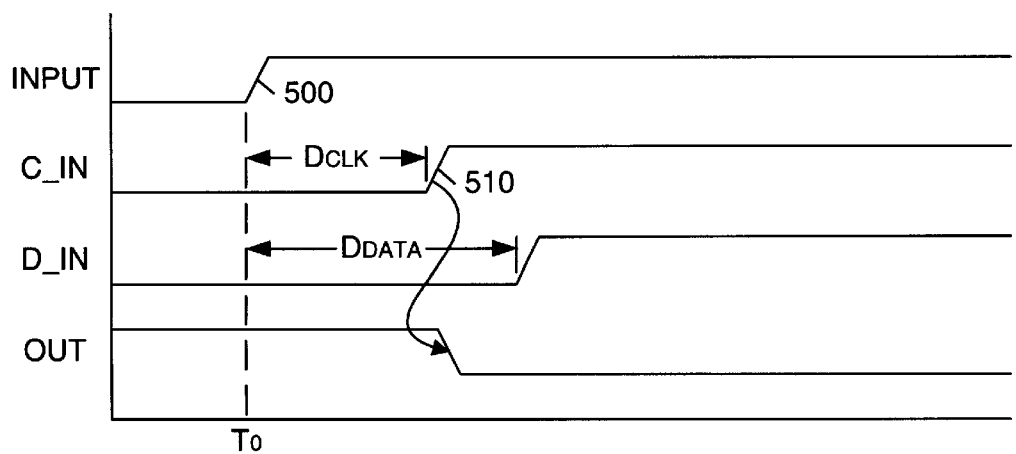
FIG. 5A is a waveform diagram depicting a test of FPGA 310 of FIGS. 3 and 4 to determine whether the various IOBs meet a zero-hold-time requirement.

FIG. 5A is a waveform diagram depicting a test of FPGA 310 to determine whether IOB 312B, and consequently the other IOBs 312, meets a zero-hold-time requirement. At time $T_0$, tester 305 outputs signal transition 500 on input line 317. Signal transition 500 traverses both the data path through delay element 425 to the input terminal D_IN of storage element 430 and the clock path through selection circuit 445 to the clock terminal of storage element 430.

In this example, the clock delay $D_{CLK}$ induced by the clock network is less than the data delay $D_{DATA}$ induced in the data path. Consequently, the clock edge 510 beats the data edge 520 in the race to storage element 430 so that storage element 430 correctly stores the data present on input pin 325 prior to the arrival of transition 500. This example thus illustrates the case where IOB 312B meets a zero-hold-time requirement when both of delay elements 450 are included in the input data path. Similar tests can be used to confirm that the zero-hold-time requirement is met when attempting to store logic-ones in storage element 430. Such tests are performed by inverting the sense of the clock signal, using inverter 465 of selection circuit 445, and providing a falling edge on input pin 325.

Tester 305 need not make a precise or accurate measurement to ensure zero-hold-time requirements are met, because both the clock and data inputs are the same signal and are therefore necessarily simultaneous. Further, the timing of the output signal on output pin 340 is not relevant to the test. Tester 305 can therefore be a relatively inexpensive piece of test equipment.

Configuration 400 represents a problematic timing scenario because the ratio of data-path delay to clock-path delay is small for the storage element under test. The timing scenario can be made still worse by connecting additional resources, e.g., other IOBs and CLBs, to clock line 410, thus increasing the associated clock delay. The actual worst-case configuration would typically include a clock path in which every circuit component that could be connected to the clock path was connected to the clock path. In practice, however, an FPGA is very unlikely to encounter such a design. A test engineer should therefore evaluate a device to be tested and select a combination of data and clock paths that exhibits an expected worst-case scenario. The expected worst-case scenario should then be used for testing whether the device complies with a zero-hold-time requirement.

Figure 5B:
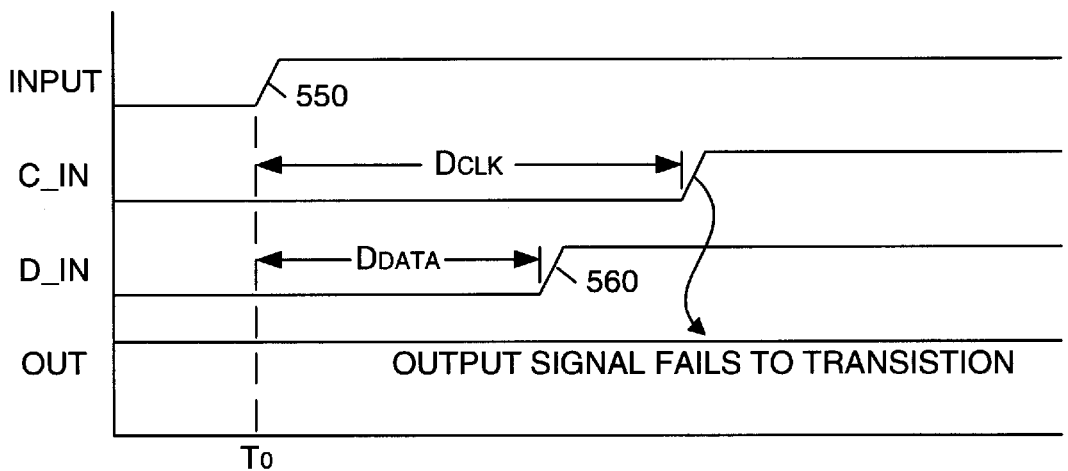
FIG. 5B is a waveform diagram depicting a test of FPGA 310 of FIGS. 3 and 4 in which FPGA 310 fails to meet a zero-hold-time requirement.

FIG. 5B is another waveform diagram depicting a test of FPGA 310 in which FPGA 310 fails to meet a zero-hold-time requirement. At time $T_0$, tester 305 outputs a signal transition 550 on input line 317. Signal transition 550 traverses both the data path through delay element 425 to the input terminal D_IN of storage element 430 and the clock path through selection circuit 445 to the clock terminal of storage element 430. Selection circuit 445 is configured as non-inverting.

In this example, the delay through delay element 425 is insufficient to meet a zero-hold-time requirement for data presented on input pin 325. That is, the data on line D_IN is clocked into storage element 430 only after the data has changed states (edge 560). The output signal on output pin 340 to tester 305 fails to transition, and is therefore incorrect. The incorrect voltage level on output pin 340 signals a hold-time violation. Tester 305 notes the incorrect voltage level and signals the failure.

Figure 6:
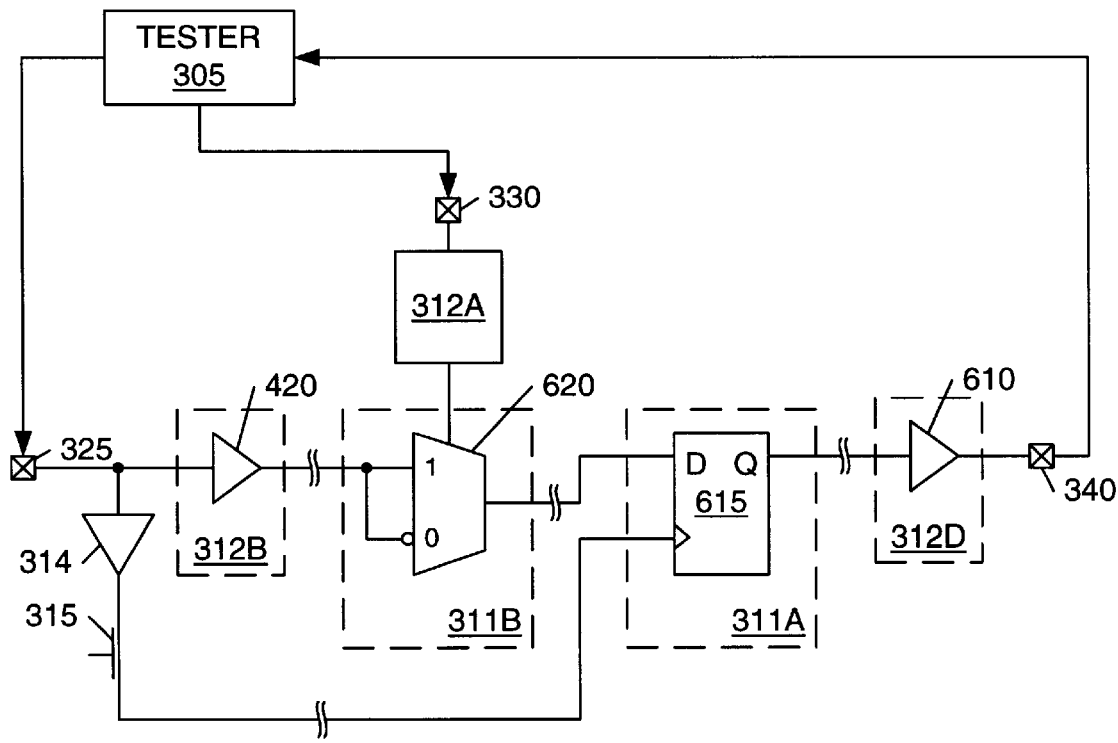
FIG. 6 depicts a block diagram of an FPGA configuration used to determine whether a zero-hold-time requirement is met by a sequential storage element within a configurable logic block of FPGA 310.

FIG. 6 depicts a block diagram of an FPGA configuration used to determine whether a zero-hold-time requirement is met by a sequential storage element within a configurable logic block of FPGA 310. Many different configuration scenarios can be imagined for which it might be desirable to ensure a zero-hold-time requirement is met. The configuration of FIG. 6 is an exemplary worst-case scenario designed to test whether data signals that traverse one CLB on the way to a sequential storage element in an adjacent CLB meet a zero-hold-time requirement.

As discussed above in connection with FIGS. 3 and 4A, FPGA 310 includes a pair of CLBs 311A and 311B, a pair of IOBs 312B and 312D, a pass transistor 315, and a clock buffer 314. IOBs 312B and 312D include respective input and output buffers 420 (FIG. 4B) and 610. CLB 311A includes a storage element 615, the subject of a zero-hold-time test. CLB 311B is included to selectively invert the sense of the signal provided to the data terminal D of storage element 615, and is therefore configured as a two-input multiplexer 620 with a control terminal connected to an output terminal of tester 305 via IOB 312A and input pin 330. CLB 311B additionally delays the data signal on input pin 325. IOB 312B is configured to bypass delay element 425 (FIG. 4B) to test whether a single CLB introduces enough delay to ensure that flip-flop 615 meets a zero-hold-time requirement.

The data path between input pin 325 and storage element 615 is relatively short, while the clock path from clock buffer 314 to storage element 615 is relatively long. Thus, if this configuration satisfies the zero-hold-time requirement, other combinations of CLBs are reasonably certain to satisfy the requirement.

Once configured as shown, the process of testing the configuration is substantially the same as described above in connection with FIGS. 4A through 5B. The use of CLB 311B configured to include multiplexer 620 allows tester 305 to select between rising and falling data on the D input terminal of storage element 615, and to test both clock edges.

While the present invention has been described in connection with specific embodiments, variations of these embodiments will be obvious to those of ordinary skill in the art. For example, while described in the context of programmable logic devices, a method in accordance with the invention could be applied to other types of circuits. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A programmed programmable logic device (PLD) comprising:
   a. a PLD input pin and a PLD output pin;
   b. a clock distribution network connected to the PLD input pin and having a plurality of distributed-clock output terminals such that a signal transition on the PLD input pin passes over the clock distribution network to the distributed-clock output terminals; and
   c. a programmable input block having:
      i. a data input terminal connected to the PLD input pin such that the signal transition on the PLD input pin passes from the PLD input Din to the data input terminal;
      ii. a clock input terminal connected to one of the distributed-clock output terminals such that the signal transition on the PLD input pin passes over the clock distribution network to the clock input terminal; and
      iii. an input-block output terminal connected to the PLD output pin.

2. The PLD of claim 1, further comprising an output block, wherein the input-block output terminal connects to the PLD output pin through the output block.

3. The PLD of claim 1, the clock distribution network including a plurality of clock paths defined between the distributed-clock input terminal and the plurality of distributed-clock output terminals, wherein the clock path from the distributed-clock input terminal to the clock input terminal of the input block exhibits the longest signal delay of the plurality of clock paths.

4. The PLD of claim 1, wherein the input block further comprises a sequential storage element having a storage-element data terminal connected to the data input terminal and a storage-element clock terminal connected to the one of the distributed-clock output terminals.

5. The PLD of claim 4, the input block further comprising a programmable delay element connected between the data input terminal and the storage-element data terminal.

6. The PLD of claim 5, wherein the programmable delay element supports a maximum-delay configuration and a minimum-delay configuration, and wherein the programmable delay element is configured in the maximum-delay configuration.

7. The PLD of claim 4, the input block further comprising a programmable clock-signal inverter connected between the clock input terminal and the storage-element clock terminal.

8. A system comprising:
   a. a programmed programmable logic device (PLD) comprising:
      i. a PLD input pin and a PLD output pin;
      ii. a clock distribution network connected to the PLD input pin and having a plurality of distributed-clock output terminals such that a signal transition on the PLD input pin passes over the clock distribution network to the distributed-clock output terminals;
      iii. a programmable input block having:
         (1) a data input terminal connected to the PLD input pin such that the signal transition on the PLD input pin passes from the PLD input pin to the data input terminal;
         (2) a clock input terminal connected to one of the distributed-clock output terminals such that the signal transition on the PLD input pin passes over the clock distribution network to the clock input terminal; and
         (3) an input-block output terminal connected to the PLD output pin; and
   b. a tester having a test-signal output node connected to an input pin of the programmable logic device, the tester adapted to provide the signal transition on the PLD input pin.

9. The system of claim 8, wherein the programmable input block further comprises a programmable delay element.

10. The system of claim 9, wherein the programmable delay element connects between the data input terminal of the programmable input block and the input-block output terminal.

11. A method for determining whether a sequential storage element of a programmable logic device meets a zero-hold-time requirement, the storage element having a data terminal, a clock terminal, and an output terminal, the method comprising:
   a. programmably connecting the data terminal of the storage element to an input pin of the programmable logic device through a data path between the input pin and the data terminal;
   b. programmably connecting the clock terminal of the storage element to the input pin of the programmable logic device through a clock path between the input pin and the clock terminal;
   c. providing a signal transition on the input pin so that the signal transition traverses the data and clock paths; and
   d. monitoring the output terminal of the storage element.

12. The method of claim 11, wherein the clock path is one of a plurality of potential clock paths on the programmable logic device, each potential clock path having a signal propagation delay, the clock path having the longest signal propagation delay of the potential clock paths.

13. The method of claim 11, wherein the data path is one of a plurality of potential data paths, each potential data path having a signal propagation delay, the data path having the shortest signal propagation delay of the potential data paths.

14. The method of claim 11, wherein the data path is a selected one of a plurality of potential data paths, each potential data path having a signal propagation delay, the selected data path having the shortest signal propagation delay of the potential data paths.

15. A programmed programmable logic device comprising:
   a. an input pin;
   b. a sequential storage element having a data terminal, a clock terminal, and an output terminal;
   c. a data path programmed to connect the data terminal of the storage element to the input pin of the programmable logic device;
   d. a clock path programmed to connect the clock terminal of the storage element to the input pin of the programmable logic device;
   e. means for providing a signal transition on the input pin so that the signal transition traverses the data and clock paths; and
   f. means for monitoring the output terminal of the storage element.

16. The programmable logic device of claim 15, wherein the clock path is formed in a clock distribution network connected to the input pin of the programmable logic device and having a plurality of distributed-clock output terminals.

17. The programmable logic device of claim 16, wherein the clock distribution network includes a plurality of clock paths defined between the input terminal and the plurality of distributed-clock output terminals, wherein the clock path from the input terminal to the storage element exhibits the longest signal delay of the plurality of clock paths.

* * * * *